(12) United States Patent
Choi

(10) Patent No.: US 7,053,672 B2
(45) Date of Patent: May 30, 2006

(54) METHOD AND APPARATUS FOR DETECTING SEMICONDUCTOR CHARACTERIST VARIATIONS

(75) Inventor: Jun Gi Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 46 days.

(21) Appl. No.: 10/878,444

(22) Filed: Jun. 28, 2004

(65) Prior Publication Data

US 2005/0206430 A1    Sep. 22, 2005

(30) Foreign Application Priority Data

Mar. 18, 2004  (KR) ............... 10-2004-0018479

(51) Int. Cl.
*H03K 5/22*    (2006.01)
(52) U.S. Cl. .......................... 327/65; 327/66
(58) Field of Classification Search ............. 327/65, 327/66
See application file for complete search history.

(56) References Cited

U.S. PATENT DOCUMENTS 5,963,079 A * 10/1999 Hoang .................. 327/512
6,573,746 B1 * 6/2003 Kim et al. .................. 326/30

* cited by examiner

*Primary Examiner*—Kenneth B. Wells
(74) *Attorney, Agent, or Firm*—Ladas & Parry LLP

(57) ABSTRACT

The present invention discloses a skew detection device which can detect a skew of a transistor changed due to a driving voltage, a size and a process variable. The skew detection device includes a first potential level generator for outputting a first voltage, a second potential level generator for outputting a second voltage, a first level shifter for receiving the first voltage and outputting a first shift voltage, a second level shifter for receiving the second voltage and outputting a second shift voltage, and a comparator for comparing the first shift voltage with the second shift voltage. The first voltage is determined according to a drain-source current of a first MOS transistor operated in a linear region, and the second voltage is determined according to a drain-source current of a second MOS transistor operated in a saturation region.

7 Claims, 4 Drawing Sheets

METHOD AND APPARATUS FOR DETECTING SEMICONDUCTOR CHARACTERIST VARIATIONS

BACKGROUND OF THE INVENTION

1. Field of the Invention

The present invention relates to a skew detection device, and more particularly to, a skew detection device which can detect a skew of a transistor changed due to a driving voltage, a size and a process variable.

2. Description of the Prior Art

FIG. 1 is a graph showing saturation current characteristics of a general NMOS transistor (W/L=40/1) by skew and temperature variations.

Referring to FIG. 1, an ordinate axis shows a drain-source current Ids of the NMOS transistor, and a transverse axis shows temperature variations (−10° C., 25° C., 90° C.). TYP, SLOW and FAST on the transverse axis denote current characteristics of the NMOS transistor. That is, TYP means a typical group existing within the current characteristics range required by a manufacturer, SLOW means a group having lower current characteristics than the TYP group transistor (namely, group having small current quantity), and FAST means a group having higher current characteristics than the TYP group transistor (namely, group having large current quantity). Differences of the transistors in current characteristics result from process variables. For example, the current characteristics of the transistor are changed due to variations of a thickness of a gate insulating film, a width/length W/L, a sheet resistance and a threshold voltage Vth. For information, 'skew' is defined as characteristics variations of a transistor by process variables or the likes.

Still referring to FIG. 1, a variation width of the drain current Ids is larger when the drain-source voltage Vds is high than when it is low. When the drain-source voltage Vds is 1V, the variation width of the drain current Ids is about 3.03 mA, but when the drain-source voltage Vds is 0.2V, the variation width of the drain current Ids is about 0.8 mA.

The variation width of the current is considerably changed due to the drain-source voltage Vds in FIG. 1, which results from current curve characteristics of the transistor. The current curve characteristics of the transistor will now be explained with reference to FIG. 2.

FIG. 2 is a graph showing a current-voltage characteristic curve of the NMOS transistor.

In FIG. 2, an ordinate axis shows a drain-source current Ids, and a transverse axis shows a drain-source voltage Vds.

As illustrated in FIG. 2, when the drain-source voltage Vds is 0.2V, the transistor is positioned in a linear region, and when the drain-source voltage Vds is 1V, the transistor is positioned in a saturation region.

Here, the variation width of the current is larger in the saturation region than in the linear region, which corresponds to the information of FIG. 1.

As described above, the current characteristics of the transistor are remarkably changed due to the process variables (thickness of gate insulating film, width/length W/L, sheet resistance and threshold voltage Vth), and a size of the driving voltage.

When the characteristics of the transistor are seriously changed, a circuit design is more complicated.

SUMMARY OF THE INVENTION

Accordingly, the present invention has been made in an effort to solve the problems occurring in the related art, and an object of the present invention is to provide a skew detection device which can detect characteristics variations (namely, skew) of a transistor.

Another object of the present invention is to provide a skew detection device which can detect a skew of a transistor by using characteristics of a transistor operated in a linear region and a transistor operated in a saturation region.

In order to achieve the above objects, according to one aspect of the present invention, there is provided a skew detection device, including: a first potential level generator for outputting a first voltage; a second potential level generator for outputting a second voltage; a first level shifter for receiving the first voltage and outputting a first shift voltage; a second level shifter for receiving the second voltage and outputting a second shift voltage; and a comparator for comparing the first shift voltage with the second shift voltage, wherein the first voltage is determined according to a drain-source current of a first MOS transistor operated in a linear region, and the second voltage is determined according to a drain-source current of a second MOS transistor operated in a saturation region.

According to another aspect of the present invention, a skew detection device includes: a first transistor coupled between a first voltage and a first node; a second transistor coupled between the first node and a ground; a third transistor coupled between a second voltage and a second node; a fourth transistor coupled between the second node and the ground; a first level shifter for receiving the voltage of the first node and rising a voltage level; a second level shifter for receiving the voltage of the second node and rising a voltage level; and a comparator for comparing the output voltages from the first and second level shifters, wherein the first transistor is operated in a linear region, the third transistor is operated in a saturation region, and the second and fourth transistors are operated as resistance elements, by controlling gate voltages supplied to gates of the first to fourth transistors.

According to still another aspect of the present invention, a skew detection device includes: a first transistor coupled between a first voltage and a first node; a second transistor coupled between the first node and a ground; a third transistor coupled between a second voltage and a second node; a fourth transistor coupled between the second node and the ground; a first level shifter for receiving the voltage of the first node and rising a voltage level; a second level shifter for receiving the voltage of the second node and rising a voltage level; and a comparator for comparing the output voltages from the first and second level shifters, wherein the second voltage is supplied to a gate of the first transistor and a gate of the third transistor, the first voltage is supplied to a gate of the second transistor and a gate of the fourth transistor, and the first voltage is lower than the second voltage.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
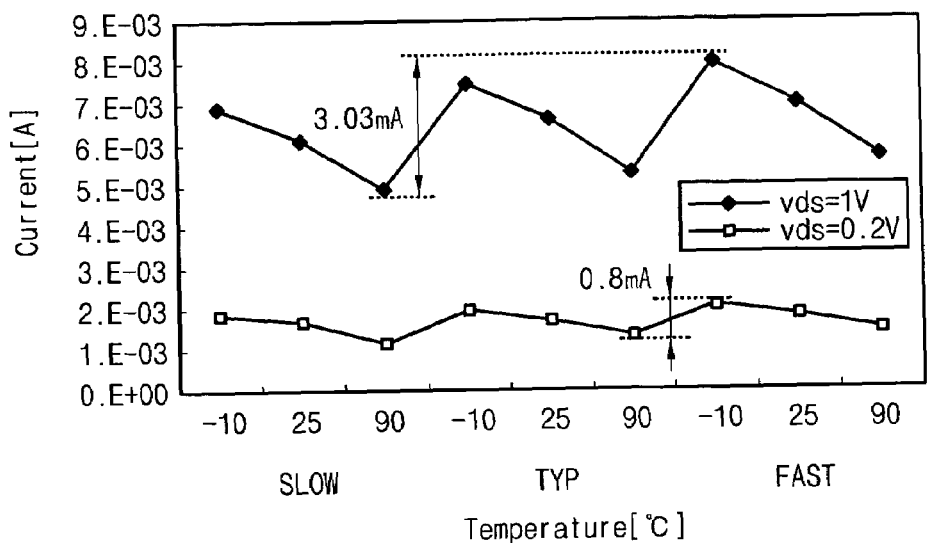
FIG. 1 is a graph showing saturation current characteristics of a general NMOS transistor by skew and temperature variations.
Figure 2:
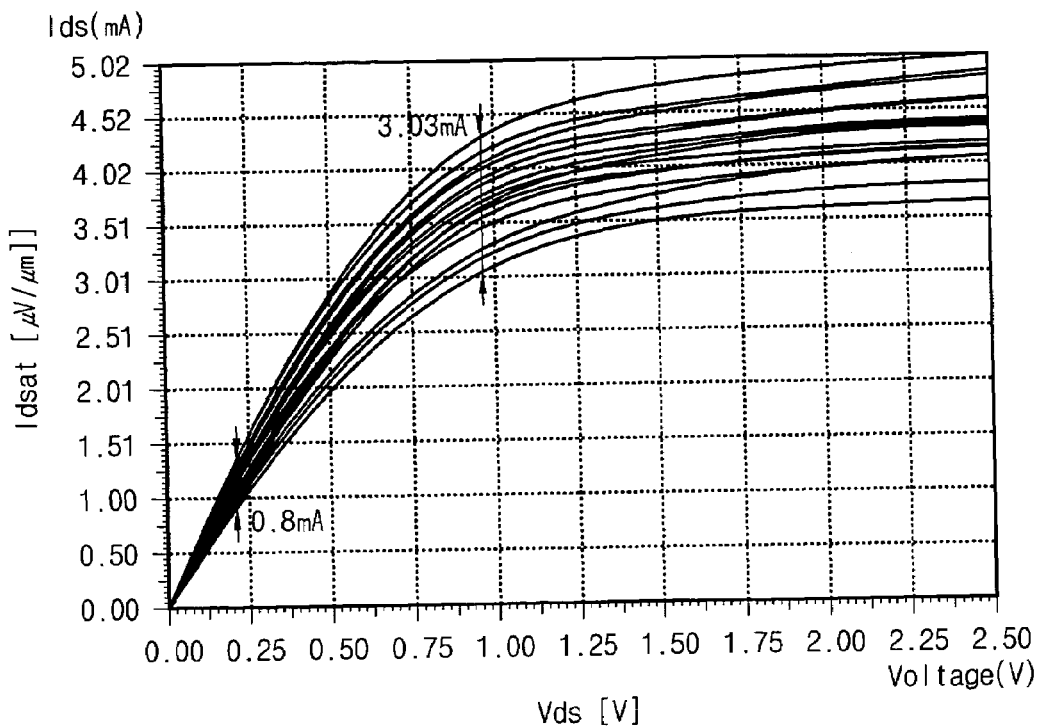
FIG. 2 is a graph showing a current-voltage characteristic curve of the NMOS transistor.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3A:
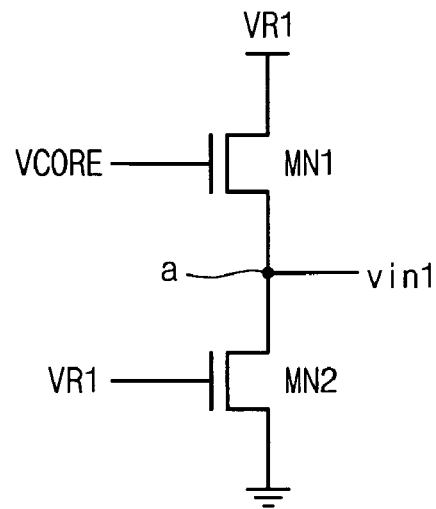
FIGS. 3a and 3b are circuit diagrams illustrating a potential level generator for a skew detection device in accordance with the present invention.
Figure 3B:
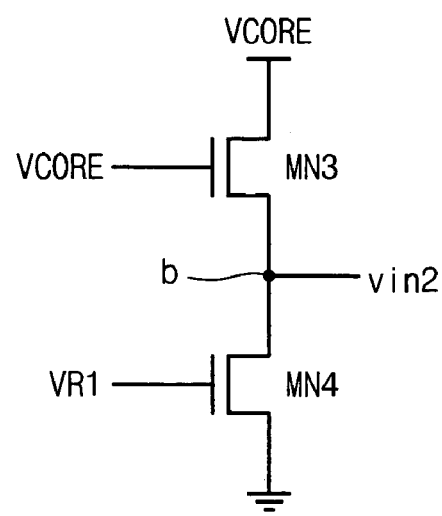

FIGS. 3a and 3b are circuit diagrams illustrating a potential level generator for a skew detection device in accordance with the present invention.

As illustrated in FIG. 3a, transistors MN1 and MN2 are connected in series between a driving voltage VR1 and a ground, a voltage VCORE is supplied to a gate of the transistor MN1, and a voltage VR1 is supplied to a gate of the transistor MN2. An output voltage vin1 is outputted through a node (a) which is a source of the transistor MN1.

As shown in FIG. 3b, transistors MN3 and MN4 are connected in series between a driving voltage VCORE and a ground, a voltage VCORE is supplied to a gate of the transistor MN3, and a voltage VR1 is supplied to a gate of the transistor MN4. An output voltage vin2 is outputted through a node (b) which is a source of the transistor MN3.

In order to embody technical ideas of the invention, the transistor MN1 of FIG. 3a is designed to be operated in a linear region, and the transistor MN3 of FIG. 3b is designed to be operated in a saturation region.

That is, the potential level generator of FIG. 3a must satisfy Vgs−Vth>Vds (Vgs=Vcore−vin1, Vds=VR1−vin1, and Vth is a threshold voltage of the transistor MN1), and the potential level generator of FIG. 3b must satisfy Vgs−Vth<Vds (Vgs=Vcore−vin2, Vds=Vcore−vin2, and Vth is a threshold voltage of the transistor MN3). For this, the level of the voltage VR1 is set lower than that of the voltage VCORE in FIGS. 3a and 3b. Preferably, the voltages VR1 and VCORE are outputted from an internal reference voltage generator of a semiconductor device.

The transistor MN2 of FIG. 3a is operated as a MOS resistance for biasing the output voltage vin1, and the transistor MN4 of FIG. 3b is operated as a MOS resistance for biasing the output voltage vin2.

As shown in FIGS. 3a and 3b, the voltage of the node (a) is determined according to a drain-source current of the transistor MN1 operated in the linear region, and the voltage of the node (b) is determined according to a drain-source current of the transistor MN3 operated in the saturation region.

The NMOS transistors of FIGS. 3a and 3b can be replaced by PMOS transistors.

Figure 4:
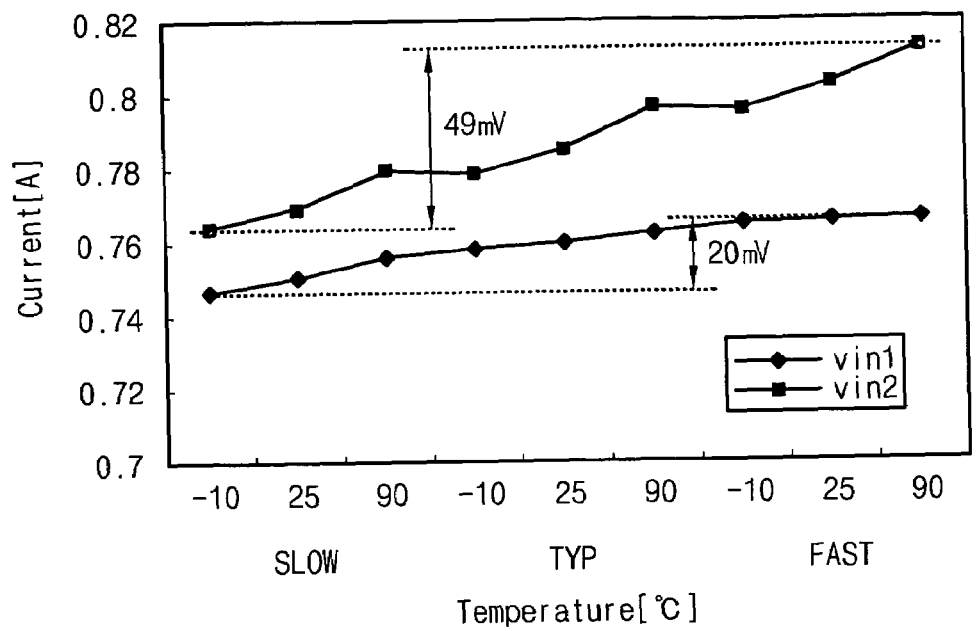
FIG. 4 is a graph showing variations of output voltages of FIGS. 3a and 3b by skew and temperature variations.

FIG. 4 is a graph showing variations of the output voltages vin1 and vin2 of FIGS. 3a and 3b by skew and temperature variations.

Referring to FIG. 4, a variation width of the output voltage vin1 of FIG. 3a by the skew and temperature variations is about 20 mV, and a variation width of the output voltage vin2 of FIG. 3b by the skew and temperature variations is about 49 mV. Accordingly, the variation width of the output voltage vin1 of the circuit operated in the linear region is smaller than that of the output voltage vin2 of the circuit operated in the saturation region.

Figure 5:
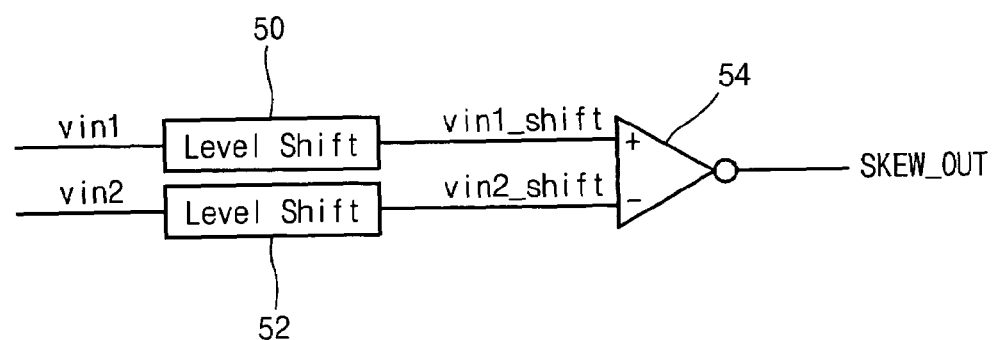
FIG. 5 is a circuit diagram illustrating the skew detection device in accordance with the present invention.

FIG. 5 is a circuit diagram illustrating the skew detection device in accordance with the present invention.

As depicted in FIG. 5, the skew detection device detects a skew by supplying the output voltages vin1 and vin2 of FIGS. 3a, 3b and 4 to level shifters. The level shifters are used in FIG. 5 because the levels of the output voltages vin1 and vin2 detected in FIGS. 3a and 3b are very low. Here, the voltage level shifting functions of each level shifter 50 and 52 may be more or less different.

The skew detection device includes a level shifter 50 for receiving the output voltage vin1 of FIG. 3a and transiting a voltage level, a level shifter 52 for receiving the output voltage vin2 of FIG. 3b and rising a voltage level, and a comparator 54 for comparing the output voltages vin1_shift and vin2_shift from the level shifters 50 and 52. When the output voltage vin1_shift is higher than the output voltage vin2_shift, the output signal SKEW_OUT from the comparator 54 has a high level. Conversely, when the output voltage vin1_shift is lower than the output voltage vin2_shift, the output signal SKEW_OUT from the comparator 54 has a low level.

Figure 6:
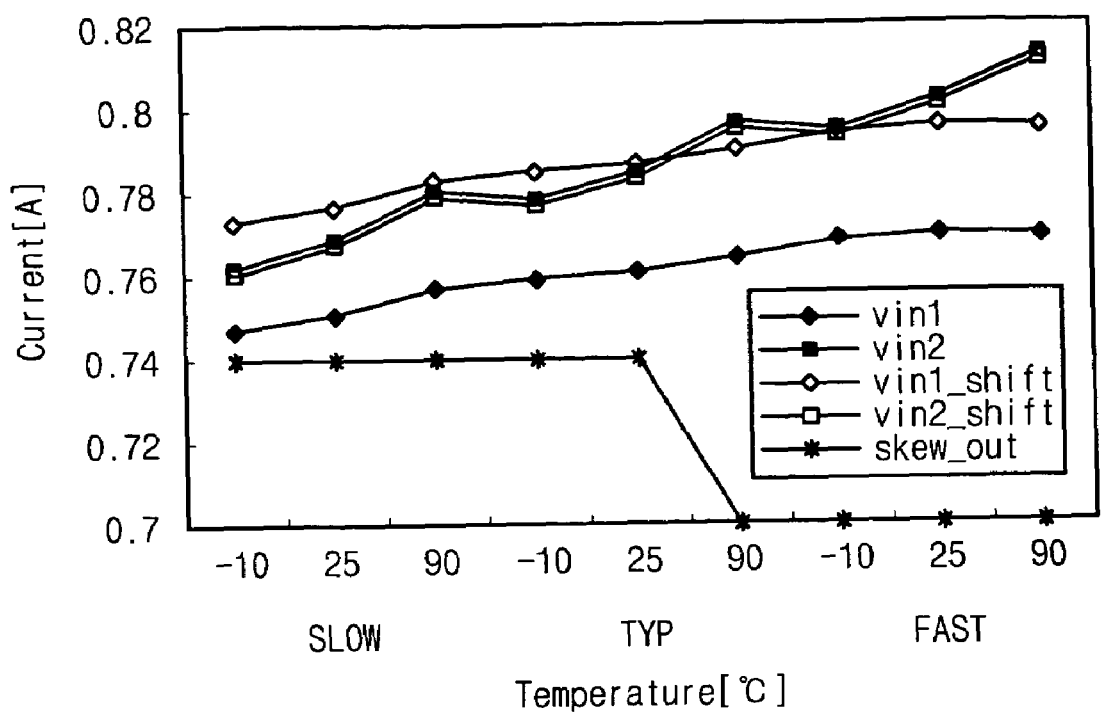
FIG. 6 is a graph showing signals used for the skew detection device of FIG. 5.

FIG. 6 is a graph showing the signals vin1 and vin2 supplied to the skew detection device of FIG. 5, the output signals vin1_shift and vin2_shift from the level shifters 50 and 52, and the output signal SKEW_OUT from the comparator 54.

As shown in FIG. 6, when the skew exists within the TYP and SLOW ranges, the output signal SKEW_OUT has a high level, and when the skew exists within the FAST range, the output signal SKEW_OUT has a low level.

After the range of the skew is decided, the output signal SKEW_OUT of FIG. 5 is fed back to the internal circuit of the semiconductor device, for controlling an operation speed of the internal circuit. When the output signal SKEW_OUT from the comparator 54 has a high level, the current operation state of the internal circuit is maintained. Conversely, when the output signal SKEW_OUT from the comparator 54 has a low level, the operation speed of the internal circuit is controlled. For example, a signal processing speed is controlled by adjusting a delay time of a delay unit.

As apparent from the above description, the operation speed of the internal circuit is controlled by using the output signal from the skew detection device. For example, when delay quantities are different in a delay circuit due to the skew, they can be controlled by using the output signal from the skew detection device. As a result, the skew detection device stabilizes the internal operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A skew detection device, comprising:
    a first potential level generator for outputting a first voltage;
    a second potential level generator for outputting a second voltage;
    a first level shifter for receiving the first voltage and outputting a first shift voltage;
    a second level shifter for receiving the second voltage and outputting a second shift voltage; and
    a comparator for comparing the first shift voltage with the second shift voltage, wherein the first voltage is determined according to a drain-source current of a first MOS transistor operated in a linear region, and the second voltage is determined according to a drain-source current of a second MOS transistor operated in a saturation region.

2. The device of claim 1, wherein the first and second MOS transistors are NMOS transistors.

3. A skew detection device, comprising:
a first transistor coupled between a first voltage and a first node;
a second transistor coupled between the first node and a ground;
a third transistor coupled between a second voltage and a second node;
a fourth transistor coupled between the second node and the ground;
a first level shifter for receiving the voltage of the first node and rising a voltage level;
a second level shifter for receiving the voltage of the second node and rising a voltage level; and
a comparator for comparing the output voltages from the first and second level shifters,
wherein the first transistor is operated in a linear region, the third transistor is operated in a saturation region, and the second and fourth transistors are operated as resistance elements, by controlling gate voltages supplied to gates of the first to fourth transistors.

4. The device of claim 3, wherein the first to fourth transistors are NMOS transistors.

5. A skew detection device, comprising:
a first transistor coupled between a first voltage and a first node;
a second transistor coupled between the first node and a ground;
a third transistor coupled between a second voltage and a second node;
a fourth transistor coupled between the second node and the ground;
a first level shifter for receiving the voltage of the first node and rising a voltage level;
a second level shifter for receiving the voltage of the second node and rising a voltage level; and
a comparator for comparing the output voltages from the first and second level shifters.

6. The device of claim 5, wherein the second voltage is supplied to a gate of the first transistor and a gate of the third transistor, the first voltage is supplied to a gate of the second transistor and a gate of the fourth transistor, and the first voltage is lower than the second voltage.

7. The device of claim 5, wherein the first to fourth transistors are NMOS transistors.

* * * * *